United States Patent [19]

Lewis et al.

[11] Patent Number: 5,139,430
[45] Date of Patent: Aug. 18, 1992

[54] PCB INSERTION/EJECTION LEVER MECHANISM

[75] Inventors: Jeffrey M. Lewis, Maynard; Rae-Ann S. Locicero, Acton, both of Mass.; William A. Izzicupo, Windham, N.H.

[73] Assignee: Digital Equipment Corporation, Maynard, Mass.

[21] Appl. No.: 545,365

[22] Filed: Jun. 28, 1990

[51] Int. Cl.$^5$ ............................................ H01R 13/62
[52] U.S. Cl. ...................................... 439/157; 439/160
[58] Field of Search ................................. 29/829-831; 361/413-415; 439/152-160, 372, 476, 480, 483; 403/16

[56] References Cited

U.S. PATENT DOCUMENTS

| | | | |
|---|---|---|---|
| T876,004 | 7/1970 | Andreini et al. | 439/157 |
| 3,335,386 | 8/1967 | Upton | 439/157 |
| 4,071,722 | 1/1978 | Hart | 439/157 |
| 4,083,616 | 4/1978 | McNiece et al. | |
| 4,152,038 | 5/1979 | Inouye et al. | |
| 4,183,602 | 1/1980 | Meunier et al. | 439/157 |
| 4,313,150 | 1/1982 | Chu | |
| 4,426,122 | 1/1984 | Lainez et al. | |
| 4,521,063 | 6/1985 | Milc | |
| 4,530,615 | 7/1985 | Katsuura et al. | |
| 4,619,368 | 10/1986 | Kappelt, Jr. | |
| 4,648,009 | 3/1987 | Beun et al | 439/160 |
| 4,746,015 | 5/1988 | Kaucic | |
| 4,896,777 | 1/1990 | Lewis | |
| 4,917,618 | 4/1990 | Behrens et al. | 439/157 |
| 4,947,289 | 8/1990 | Dynie | 439/160 |

Primary Examiner—David Pirlot
Attorney, Agent, or Firm—Arnold, White & Durkee

[57] ABSTRACT

A mechanical insertion/ejection lever device is provided for use in mounting a printed circuit board (PCB) into an electrical receptacle secured to a housing. Two lever members are pivotally mounted at or near the rear edge of a PCB, adjacent the corners. As the PCB is manually inserted into the housing unit, the lever members engage part of the housing. Rotation of the lever members causes a proportional linear motion of the PCB into engagement of the receptacle, overcoming frictional resistance of the electrical connectors. The lever members are rotatable through an arc of motion which corresponds to moving the PCB a linear distance sufficient to compensate for all accumulated manufacturing tolerances while fully seating the PCB within the receptacle. The lever members adjustably lock to retain the PCB in a fully seated position. The lever members also eject the PCB from the receptacle upon rotation in an opposite direction.

4 Claims, 3 Drawing Sheets

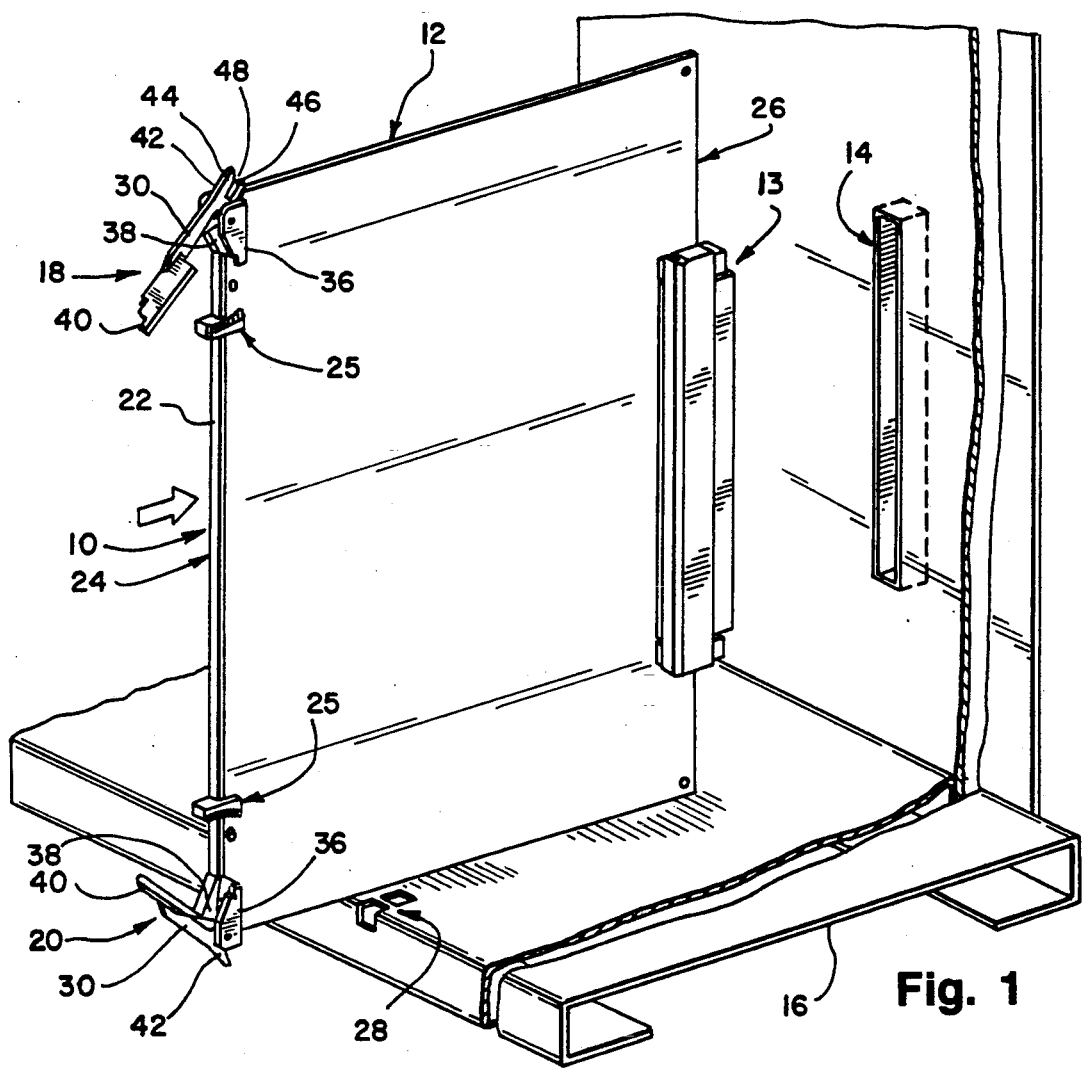
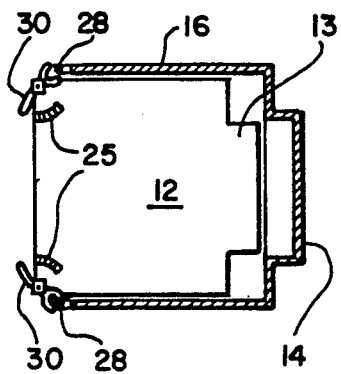
Fig. 2
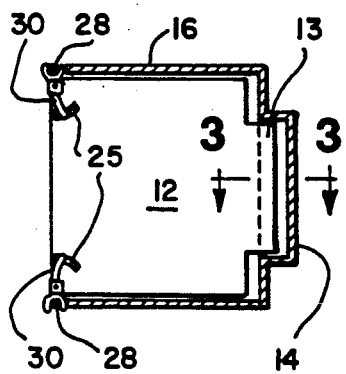
Fig. 3
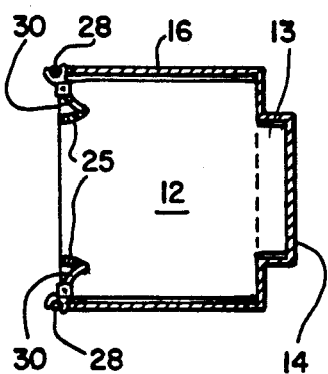
Fig. 4

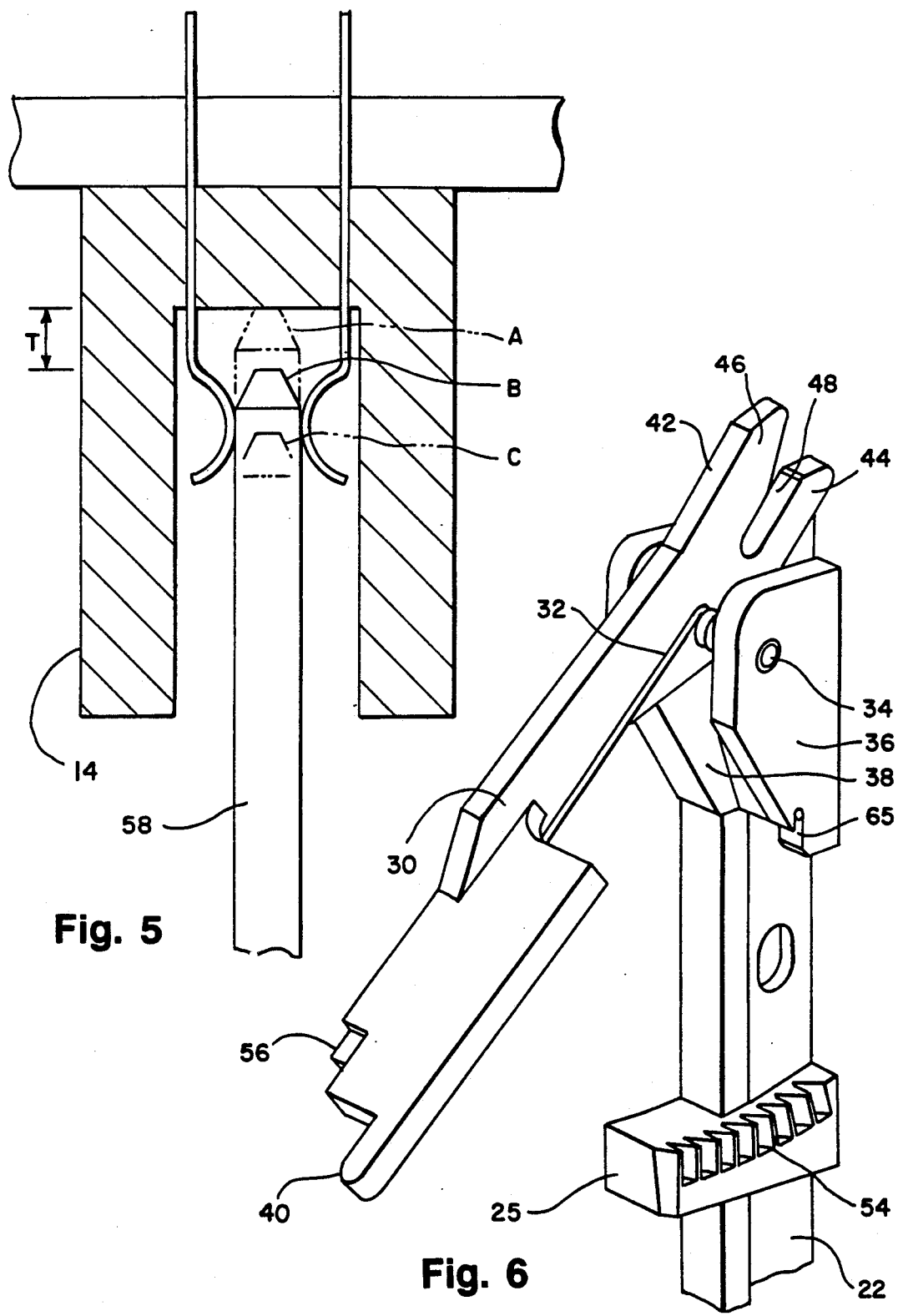

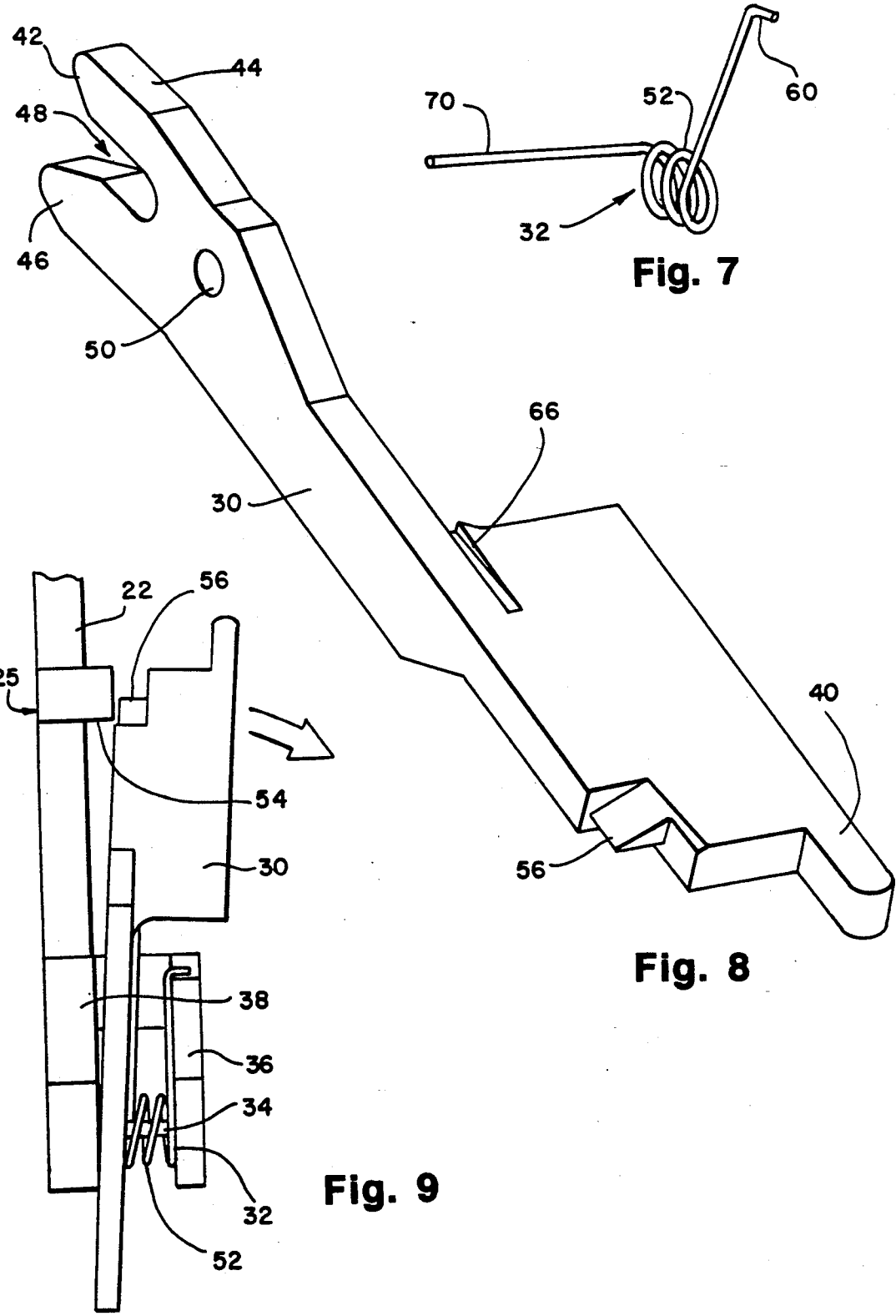

PCB INSERTION/EJECTION LEVER MECHANISM

BACKGROUND OF THE INVENTION

1. Field of the Invention

The present invention relates to mechanical devices used for mounting a printed circuit board (PCB) into an appropriate receptacle. More particularly, it concerns levered mechanisms for use in inserting a PCB into a socket or receptacle to effect an electrical interface, maintaining the PCB in the fully engaged position during use and removing the PCB from the socket or receptacle.

2. Description of the Prior Art

Printed circuit boards are typically inserted manually or with the assistance of a mechanical device into a receptacle or socket for making an electrical connection between the PCB and the socket. The socket is mounted within a housing or structural frame which forms part of an overall unit. In a typical pin and socket PCB, a plurality of electrical contacts or pins are positioned in a connector which is mounted on the PCB adjacent the front edge thereof. The PCB is inserted into the socket by sliding the electrical contacts of the connector mounted on the PCB into an elongated opening in the socket until the electrical contacts are fully seated. When the PCB is properly inserted into the socket, electrical contact is established between the plurality of contacts of the connector on the PCB and the socket.

Various mechanical levered devices are available for assisting in properly inserting a PCB into the socket when manual insertion is not feasible. One such known mechanical levered device is pivotally mounted on or near the rear edge of a PCB and applies a leverage force against part of the housing or frame to aid in forcing the PCB connector into the elongated opening of the socket. This mechanical levered device merely pushes the connector into the socket until the lever action stops. The linear travel of the connector is always the same and is fixed by the mechanical device itself.

All PCB's, connectors, sockets and other structural features are manufactured within certain tolerances. In addition, the electrical contacts or pins of the connector are very short. During PCB installation, mating electrical surfaces between the connector and the socket must slide over each other for a certain linear distance in order to remove oxides and contaminants for good electrical conductivity. In practice the cumulative sum of the various tolerances and the relatively short length of the electrical contacts require precise alignment between the connector and the socket in order to effect and maintain electrical conduction.

The cumulative tolerances are frequently sufficient in magnitude to exceed the maximum linear distance that the mechanical levered device can move the PCB. If the cumulative tolerances exceed this maximum linear distance, then the relative position of the electrical contacts of the connector within the socket is sufficiently altered to result in no electrical contact or a poor electrical connection when the PCB is inserted with the aid of a mechanical levered device.

In addition, under these circumstances, when the PCB connector is inserted into a socket, even if initial electrical contact is established, any vibration or movement of the overall device tends to cause separation between the PCB connector contacts and the socket with the resulting loss of electrical conductivity.

SUMMARY OF THE INVENTION

The present invention attains complete insertion of the PCB connector into the socket regardless of accumulated tolerances affecting the standard length of a PCB or dimensional differences between different printed circuit boards or other structural tolerances. The lever device of the present invention is mounted on or near the edge of the PCB which is remote from the connector. The lever device has a pair of lever assemblies separated by an elongated member. Each of the lever assemblies has a lever bar which is mounted pivotally at or near the edge of the PCB opposite the electrical contacts. After the connector is partially inserted in the socket, the frictional resistance between the PCB connector and the socket prevents further movement of the PCB with simple manual force. At this point, both lever bars are contacting a portion of the housing or frame containing the socket. The lever bars are rotated and each provides a countervailing force to the PCB moving it toward the socket and forcing the connector into the opening in the socket against the frictional force resistance to engagement which is provided by the electrical contacts in the socket. The lever device can also be effectively used before the connector comes into actual physical contact with the socket provided that the lever bars are contacting a portion of the housing or frame.

The lever assembly also includes a latching member positioned along the elongated bar and adapted to engage the lever bar of each respective lever assembly after the PCB connector is fully seated in the socket. Each lever bar can be rotated over a wide arc before being connected to a respective one of the latching members. The amount of rotational movement of the lever bars is proportional to the amount of linear movement of the PCB. The degrees of the arc of rotation of the lever bars and the corresponding range of linear movement of the PCB is made sufficiently long to compensate for the maximum accumulated tolerances possible in the system.

In the present invention, each lever bar is rotated to continuously transfer a force through the rigid, elongated member to the PCB until the connector is fully engaged in the socket and electrical contact is firmly established. At this point each lever bar is locked into the respective latching device preventing further movement. The latching members hold the lever bars in the final position and prevent the PCB from becoming disengaged from the socket. If the latching members are released and the lever bars rotated in the reverse or opposite direction a force is applied or transferred through the elongated member to the PCB causing it to eject from the socket.

BRIEF DESCRIPTION OF THE DRAWINGS

FIG. 1 is a perspective view of the lever device of the present invention mounted on a PCB and the PCB is in position for installation into a socket secured on a structural frame.

FIG. 2 is a side view of the PCB with the connector and socket making initial contact.

FIG. 3 is a side of the PCB with the connector and socket making partial engagement.

FIG. 4 is a side view of the PCB with the connector and sockets in full engagement.

FIG. 5 is a partial cross-sectional view taken along line 3—3 of FIG. 3 of the pin and socket connection in various degrees of engagement.

FIG. 6 is a detailed perspective view of one lever assembly forming part of the lever device.

FIG. 7 is a perspective view of a spring forming part of each lever assembly.

FIG. 8 is a perspective view of the bottom of the lever member of each lever assembly.

FIG. 9 is a frontal view of one lever assembly illustrating the spring being biased.

It should be understood that the drawings are not necessarily to scale and that the embodiments are sometimes illustrated by graphic symbols, diagrammatic representations and fragmentary views. In certain instances, details which are not necessary for an understanding of the present invention or which render other details difficult to perceive may have been omitted. Throughout the drawings, it should be understood, of course, that the invention is not necessarily limited to the particular embodiments illustrated herein.

DETAILED DESCRIPTION OF THE PREFERRED EMBODIMENT

A printed circuit board (PCB) insertion/ ejection lever device 10 is shown in FIG. 1 mounted on a PCB 12 having a pin connector 13. The PCB 12 is ready for installation into a socket or receptacle 14. The socket 14 is positioned within a housing or frame 16. The housing or frame 16 typically holds a plurality of sockets 14 and associated PCB's 12 but for the sake of clarity, only one combination of PCB 12 with pin connector 13 and socket 14 is shown in FIG. 1. The housing or frame 16 has an upper section which is not illustrated in FIG. 1 for the sake of clarity, however, the upper section is substantially a mirror image of the lower section of the housing or frame 16. The structure or shape of the housing or frame 16, except as it interacts with the lever device 10 as explained hereinafter, does not form part of the present invention. In a similar fashion, the function or operation of the PCB 12 or the overall unit of which it forms a portion is not part of the present invention.

The insertion/ejection lever device 10 comprises two lever assemblies 18 and 20 which are connected by a common elongated member 22. The elongated member 22 is mounted by rivets or eyelets or other suitable means to the rear edge 24 of the PCB 12. The elongated member 22 adds rigidity to the rear edge 24 of the PCB 12 and distributes the force transferred from the lever assemblies 18 and 20 across the entire length of the rear edge 24 of PCB 12. The force transferred by the lever assemblies 18 and 20 is thus uniform and results in the even or balanced linear movement of the PCB 12. In an alternative embodiment, stiffening can be performed by two shorter, elongated members mounted to the rear edge of the PCB 12. At the ends of the elongated member 22 are the two lever assemblies 18 and 20. The two lever assemblies 18 and 20 are mirror images of each other and accordingly, only one lever assembly is described in detail hereinafter. Each lever assembly 18 and 20 also comprises a latching member 25 which is secured to the elongated member 22.

The PCB 12 is generally rectangular in shape and has at least one connector 13 mounted on its front edge 26. Connector 13 has a plurality of electrical contacts or pins (not shown) which engage with a plurality of electrical contacts (not shown) within mating socket 14 when the PCB 12 is inserted. The problem of insufficient connector engagement most prominently arises with the use of pin and socket type connectors. Therefore, in the preferred embodiment shown, connectors 13 and 14 are of the pin and socket type. The principles of the present invention are equally effective if the electrical connection is of any other type, including a card-edge style connector where the contacts are strips on the PCB edge which plug into a mating receptacle fixed to the frame 16.

The PCB 12 in FIG. 1 is illustrated as being partially positioned within the housing or frame 16 with the connector 13 and the socket 14 not yet in contact. At the position shown in FIG. 1, the insertion of PCB 12 is by hand. Manual insertion typically continues until the connector 13 and the socket 14 make initial contact. FIG. 2 illustrates the point in the insertion process when the connector 13 and the socket 14 make initial contact. At this point, the friction between the mating contacts located within the connector 13 and the socket 14 becomes sufficiently large to prevent further manual insertion. If additional manual force is applied to PCB 12, there is a tendency to have the force be disproportionate or unbalanced which causes bending and even breaking of PCB 12. Of course, any extensive bending or twisting of PCB 12 tends to stress the interconnections or otherwise damage the board.

A bar 28 is formed in the housing or frame 16. The bar 28 reacts with insertion/ejection lever device 10 to fully insert or seat the PCB connector 13 into socket 14, as more fully discussed hereafter. The distance between the bar 28 and the front of the socket 14 is generally sufficient to permit the PCB 12 together with connector 13 to be positioned just in front of or in slight engagement with socket 13 when the lever device initially contacts bar 28. The insertion/ejection lever device 10 transmits force from the bar 28 to the PCB 12, forcing the connector 13 against the frictional force of the socket 14. The elongated member 22 transmits the forces to the PCB 12 evenly across the entire edge 24. This transfer of even force prevents damage to the PCB 12 through bending or twisting.

As further illustrated in FIGS. 1 and 6, the lever assembly 18 comprises lever member or bar 30, spring 32, and pin 34, shelves 36 and 38, and latching member 25. The lever member 30 mounts pivotally on the end of elongated member 22. Each lever member 30 comprises handle end 40 and an engagement end 42. Two camming pieces 44 and 46 extend from the engagement end 42. A generally V-shaped slot 48 is formed between camming pieces 44 and 46.

The bar 28 engages lever member 30 between the camming pieces 44 and 46 during PCB installation. The camming pieces 44 and 46 have rounded or angled ends to direct bar 28 into slot 48. When the PCB 12 is being installed in the structural frame 16, the user slides the PCB 12 manually into the housing or structure 16, leading with the front edge 26. As the PCB 12 is slid in, the engaging end 42 of the lever member 30 receives the bar 28 between the two camming pieces 44 and 46.

The lever members 30 are hinged by means of pin 34 to the elongated member 22. Each end of the elongated member 22 has two projecting shelves 36 and 38 forming a U-shaped pocket within which the lever member 30 is hinged. The pin 34 extends between the two shelves 36 and 38, where it is held by means of an interference fit. Between shelves 36 and 38, the pin 34 runs through the hole 50 on the lever member 30 and also through the coil portion 52 of spring 32. The pin-lever fit is preferably loosely sized such that the lever member 30 can hinge on an axis normal to the PCB plane while also having some degree of universal roll similar to a socket. Rotation of lever member 30 engaged with bar 28 causes linear movement of the PCB 12 proportional to the arc of lever rotation The degrees of the arc of rotation of the lever 30 and the corresponding range of linear movement of the PCB 12 is sufficiently long to compensate for the maximum accumulated tolerances possible in the system.

The variable position locking feature is also shown in FIGS. 1 and 6. The latching member 25 is preferably a ratchet mounted on the elongated member 22. Various locking positions are provided through the arc of motion of lever member 30 so that the linear travel of PCB 12 may be adjusted and locked, compensating for accumulated tolerances. The ratchet structure comprises several ramped teeth 54, each of which has a slightly beveled front portion and a straight back portion to provide a locking position for lever member 30. The lever handle end 40 incorporates a tooth 56. The tooth 56 engages with one of the ratchet teeth 54 locking the lever. The bias of the spring 32 against the lever member 30 holds lever tooth 56 in engagement with a ratchet tooth 54.

FIG. 3 shows the PCB in a position where the connector 13 and the socket 14 are only partially engaged. The lever members 30 have been rotated, causing linear motion of PCB 12 and forcing the connector 13 to travel into socket 14. The phantom lines indicate the portion of connector 13 within socket 14. As shown, the tip of the pins of connector 13 have not yet abutted the structure of socket 14. The lever members 30, as shown in FIG. 3, have not been rotated to the limit of their motion because the degree of lever rotation is proportional to the amount the linear travel of the connector 13. The insertion/ejection lever device 10 overcomes insufficient connector engagement by inserting the PCB 12 until the electrical connector 13 and socket 14 are fully seated. The fully seated condition is illustrated by FIG. 4, where the pins of connector 13 have abutted the internal structure of socket 14. The latching member 25 locks the lever member 30 at various degrees of rotation, adjusting and locking the linear travel of PCB 12 to compensate for accumulated tolerance. The arc of rotation of lever members 30 illustrated in FIG. 4 is arbitrary, and varies due to accumulated tolerance. As illustrated, however, the PCB 12 is manufactured to less than maximum tolerance. Additional rotation of the levers 30 is still possible if further linear travel of PCB 12 were needed due to a greater tolerance. If the PCB 12 was longer due to accumulated tolerance, connector 13 would become fully engaged with socket 14 upon less linear travel by the PCB 12. In such a case, the lever members 30 rotate over a shorter arc before connector 13 and socket 14 became fully seated.

FIG. 5 shows a single pin 58 from connector 12 inserted into a mating portion of socket 14. Condition A shows a fully inserted pin 58 properly seated against the structure of socket 14. Condition B illustrates the position of a partially engaged pin 58. Partial engagement can result in poor or no electrical contact due to insufficient wiping of contaminants from the contacts. A partially engaged pin can also vibrate loose. Condition C of FIG. 5 shows a pin 58 which is not engaged at all, having no contact with socket 14. Conditions B and C result from the accumulated tolerances exceeding the amount of linear travel that the known lever devices import to the PCB 12. In the present invention, additional rotation of lever members 30 causes additional linear travel of pin 58 over a distance T to fully seat pin 58. Of course, tolerance can accumulate in the opposite direction as well. The connector 13 of PCB 12 may be fully seated in the socket 14 using the known lever devices, however, the rear edge 24 of the PCB 12 may extend beyond the frame 16 and be susceptible to inadvertent contact or otherwise cause difficulty.

FIG. 7 shows the relaxed shape of spring 32. The spring 32 provides both a torsional force and a normal force to the lever member 30. The spring 32 has a coiled section 52 which is in compression between the inside of shelf 36 and the lever member 30. Compression of the coil section 52 biases lever member 30 against the shelf 38. The ends of the spring provide a torsional force which biases the handle end 40 in the direction away from the front PCB edge 26. Spring end 60 is held in position preferably by a notch 65 in the shelf 36.

FIG. 8 shows the underside of lever member 30. Notch 66 located in handle portion 40 retains the spring end 70 in position.

FIG. 9 shows the rocking action of the lever member 30. As the handle is rotated forward, the lever tooth 58 contacts and slides over ramped teeth 54. Alternatively, the lever member 30 can be lifted against the bias of the spring 32 when the user is applying a force to the handle end 40 so that the lever tooth 56 clears the ratchet teeth 54 during the installing operation. The handle can then be released by the user engaging the lever tooth 56 tightly with a ratchet tooth 54. Engagement of teeth 54 and 56 locks lever member 30 in position, thus retaining PCB 12 and connector 13 in a fully seated position with socket 14. When the PCB 12 is to be removed, the lock 25 is released by again lifting handle end 40 against the bias of spring 32. When the lever tooth 56 disengages a ratchet tooth 54, the lever member 30 is free to pivot. Rotation of the lever member 30 in a direction reverse to that described above forces the PCB 12 to travel in a reverse linear direction, causing connector 15 to disengage from socket 14 and ejecting PCB 12 from housing 16.

From the description thus far provided, a PCB insertion/ejection lever device that overcomes the aforementioned problems with the prior art by providing a means of effectively inserting a PCB into a socket or receptacle, retaining a PCB in a fully engaged position, and ejecting therefrom has been described. It will be apparent that the proposed PCB insertion/ejection lever device may be used in a number of PCB mounting applications and that a number of modifications can be made in the invention disclosed, particularly by those having the benefit of the foregoing teachings, without departing from the spirit of these principles. However, these features preferably are utilized together in the advantageous assembly described herein. Accordingly, while the invention disclosed herein has been described with reference to the presently contemplated invention, it is intended that this invention be limited only by the scope of the appended claims.

What is claimed is:

1. An insertion device for use in positioning a printed circuit board into electrical contact with a receptacle secured to a housing, the printed circuit board having a front edge, a plurality of electrical contacts positioned adjacent thereto and a rear edge, the receptacle having a plurality of electrical contacts adapted to engage with the plurality of electrical contacts of the printed circuit board, said insertion device comprising:
- a pair of rotatable lever means adapted to be positioned substantially at the corners of the rear edge of the printed circuit board,
- a stiffening means connected to said lever assembly and adapted to be secured to the rear edge of the printed circuit board,
- said lever means engaging said housing and capable of rotation relative thereto for transferring a force along said stiffening means to the printed circuit board causing linear movement of the printed circuit board into engagement with the receptacle until secure electrical contact is obtained, said lever means is rotatable through an arc which proportionally corresponds to the linear movement of the printed circuit board so that the printed circuit board is capable of linear movement sufficient to compensate for accumulated manufacturing tolerances while still fully seating the printed circuit board within the receptacle,
- each of said lever means comprising a projection and an elongated member having a proximal end forming a handle and a distal end having two segments forming a substantially V-shaped slot therebetween for engagement with said housing,
- a pair of latching members secured to said stiffening means at a position adjacent to said lever means, each of said latching means comprises a series of ramped teeth arranged in an arc and adapted for engagement by said projection of said lever means to latch said lever means at the position of any of said ramped teeth throughout said arc when the printed circuit board is fully inserted into the receptacle to prevent subsequent movement of the printed circuit board.

2. A device for use in inserting a printed circuit board into electrical contact with a receptacle secured to a housing, the printed circuit board having a front edge, a plurality of electrical contacts positioned adjacent thereto and a rear edge, the receptacle having a plurality of electrical contacts adapted to engage with the plurality of electrical contacts of the printed circuit board, said device comprising:
- at least one lever assembly adapted to be positioned substantially adjacent a corner of the rear edge of the printed circuit board,
- an elongated member connected to said lever assembly and adapted to be secured to the rear edge of the printed circuit board,
- said lever assembly having a lever means for engaging said housing and for rotating relative thereto which transfers a force along said elongated member to the printed circuit board causing linear movement of the printed circuit board into engagement with the receptacle,
- said lever means rotation through an arc proportionally corresponds to the linear distance moved by the printed circuit board,
- said lever means capable of being rotated to a plurality of different positions so that each printed circuit board can be moved any amount needed to compensate for accumulated tolerances before becoming fully inserted into the receptacle,
- at least one latching means connected to said elongated member and positioned adjacent to said lever assembly and comprising a series of ramped teeth arranged in an arc, and,
- said lever means engaging said latching means when the printed circuit board is fully inserted into the receptacle to prevent subsequent movement of the printed circuit board and said lever means comprising a projection for engaging any of said ramped teeth to provide locking of said lever means at substantially any point through the arc of rotation.

3. A device for use in inserting a printed circuit board into electrical contact with a receptacle secured to a housing, a the printed circuit board having a front edge, a plurality of electrical contacts positioned adjacent thereto and a rear edge, the receptacle having a plurality of electrical contacts adapted to engage with the plurality of electrical contacts of the printed circuit board, said device comprising:
- at least one lever assembly adapted to be positioned substantially adjacent a corner of the rear edge of the printed circuit board,
- an elongated member connected to said lever assembly and adapted to be secured to the rear edge of the printed circuit board,
- said lever assembly having a lever means for engaging said housing and for rotating relative thereto which transfers a force along said elongated member to the printed circuit board causing linear movement of the printed circuit board into engagement with the receptacle,
- said lever means capable of continuing rotation through an arc which proportionally corresponds to the linear distance moved by the printed circuit board until the printed circuit board moves a linear distance sufficient to compensate for accumulated tolerances and is fully inserted into the receptacle,
- at least one latching means comprising a series of ramped teeth arranged in an arc and connected to said elongated member and positioned adjacent to said lever assembly; and
- said lever means comprising a projection for engaging any of said ramped teeth to provide locking of said lever means at substantially any point through the arc of rotation and when the printed circuit board is fully inserted into the receptacle to prevent subsequent movement of the printed circuit board, 4. A device as set forth in claim 3 wherein said lever means comprises an elongated member having a proximal end forming a handle and a distal end having two segments forming a substantially V-shaped slot therebetween for engagement with said housing.

* * * * *